United States Patent
Shenai et al.

(10) Patent No.: US 6,844,251 B2
(45) Date of Patent: Jan. 18, 2005

(54) METHOD OF FORMING A SEMICONDUCTOR DEVICE WITH A JUNCTION TERMINATION LAYER

(75) Inventors: Krishna Shenai, 2259 Palmer Cir., Naperville, IL (US) 60564; Malay Trivedi, Phoenix, AZ (US); Philip Neudeck, Olmstead Falls, OH (US)

(73) Assignee: Krishna Shenai, Naperville, IL (US)

( * ) Notice: Subject to any disclaimer, the term of this patent is extended or adjusted under 35 U.S.C. 154(b) by 0 days.

(21) Appl. No.: 10/104,945

(22) Filed: Mar. 22, 2002

(65) Prior Publication Data

US 2003/0045035 A1 Mar. 6, 2003

Related U.S. Application Data

(60) Provisional application No. 60/278,142, filed on Mar. 23, 2001.

(51) Int. Cl.$^7$ ........................... H01L 21/28; H01L 21/44
(52) U.S. Cl. ....................... 438/571; 438/570; 438/576; 438/578
(58) Field of Search ........................ 257/77, 471–474, 257/478, 483, 487; 438/167, 570–582, 931

(56) References Cited

U.S. PATENT DOCUMENTS 5,967,795 A * 10/1999 Bakowsky et al. ......... 438/494
6,465,874 B2 * 10/2002 Nemoto ...................... 257/653
6,573,128 B1 * 6/2003 Singh ......................... 438/167

OTHER PUBLICATIONS

"Design Considerations and Experimental Analysis of High-Voltage SiC Barrier Rectifiers", IEEE Transactions on Electron Devices, vol. 45, No. 7, Jul. 1998, pp. 1595–1604; Kipp Jay Schoen, Jerry M. Woodall, Fellow, IEEE, James A. Cooper, Jr., Fellow, IEEE and Michael R. Melloch, Senior Member, IEEE.

"High–Voltage (>2.5kV) 4H–SiC Schottky Rectifiers Processed on Hot–Wall CVD and High–Temperature CVD Layers", Materials Science Forum vols. 264–268 (1998) pp 921–924; T. Kimoto, Q. Wahab, A. Ellison, U. Forsberg, M. Tuomlnen, R. Yakimova, A. Henry and E Janzen.

"A 4.5kV 6H Silicon Carbide Rectifier", Appl. Phys. Lett. 67 (11), Sep. 11, 1995, pp. 1561–1563; O. Kordins, J.P. Bergman, A. Henry, E. Janzen, S. Savage, J. Andre, L.P. Ramberg, U. Lindefelt, W. Hermansson, K. Berman.

"Performance Improvements with Novel Edge Termination Designs", Prof. Krishna Shenai, University of Illinois at Chicago, Chicago, IL.

"The Potential of Fast High Voltage SIC Diodes", Heins Mitlehener, Wolfgang, Bartsh, Manfred Brukmann, Karl Otto Dohnke Ulrich Weinert; Slemens AG, Corporate Technology and (*) ASI 1IT 1, IEEE 1997.

* cited by examiner

Primary Examiner—Davil A. Zarnela
Assistant Examiner—Asok Kumar Sarkar
(74) Attorney, Agent, or Firm—Marger Johnson & McCollom, P.C.

(57) ABSTRACT

A method and apparatus are provided for improving a breakdown voltage of a semiconductor device. The method includes the steps of coupling an electrode of the silicon-carbide diode to a drift layer of the semiconductor device through a charge transfer junction, said drift layer being of a first doping type and providing a junction termination layer of a relatively constant thickness in direct contact with the drift layer of the semiconductor device and in direct contact with an outside edge of the charge transfer junction, said junction termination layer extending outwards from the outside edge of the charge transfer junction, said junction termination layer also being doped with a doping material of a second doping type in sufficient concentration to provide a charge depletion region adjacent the outside edge of the charge transfer junction when the charge transfer junction is reverse biased.

25 Claims, 10 Drawing Sheets

ary to SiC devices.

METHOD OF FORMING A SEMICONDUCTOR DEVICE WITH A JUNCTION TERMINATION LAYER

This application claims the benefit of Provisional application No. 60/278,142 field Mar. 23, 2001.

FIELD OF THE INVENTION

The field of the invention relates to semiconductor devices which include Schottky junctions and more particularly to SiC devices.

BACKGROUND OF THE INVENTION

Diodes, transistors and other power control devices are an indispensable part of the manufacturing, environmental, transportation and communications systems that we have come to rely upon. Dozens of such devices are often needed within even the simplest of such systems.

While such devices are important in their current form, there is an ever increasing need to further reduce the size and power consumption of such devices. However, as the size decreases, the materials used in the construction of such devices must be adapted to meet the ever increasing electrical and thermal stress caused by the reduced size.

One promising material to meet the needs of future integrated circuits is silicon-carbide (SiC). SiC has been recognized as being the material of choice for future system.

In order to justify the migration to SiC, processes must be developed that exploit the relatively high voltage and current carrying capabilities of SiC. However, due to very poor diffusion of impurities in SiC, well-established techniques used for prior-art silicon devices can not be adapted to SiC. For example, one reference describes a mesa-type structure created by a dry etching technique where difficulties associated with edge termination are reduced by etching away the junction and depositing a passivation layer over the junction. While mesa termination by dry etching is simple, it has been unsuccessful because it suffers from edge leakage and, ultimately, edge failure at a reverse voltage that is far less than the ideal value that SiC is capable of withstanding.

Other efforts have relied upon the creation of field rings and junction termination extension regions disposed on a surface of the diode. However, field rings and junction termination extension regions may require implantation and diffusion, which is difficult for SiC. Further, the use of junction termination extension regions on the diode surface results in surface damage and leakage.

Another reference has described a three-step termination scheme using a junction termination extension. However, the p+ anode of the reference was still formed by ion implantation. Further, the use of the three-step termination scheme is complicated and requires accurate control of etch depth.

In general, all known techniques require either high energy implants that damage the SiC surface, or subject the high electric field regions to contamination and defects. Each of these techniques create the risk of defect related failure and excessive leakage current through the high electric field regions. Accordingly, a need exists for better methods to fabricate SiC devices.

SUMMARY

A method and apparatus are provided for improving the breakdown voltage of a semiconductor device. The method includes the steps of coupling an electrode of the semiconductor device to a drift layer of the semiconductor device through a charge transfer junction, said drift layer being of a first doping type and providing a junction termination layer of a relatively constant thickness in direct contact with the drift layer of the semiconductor device and in direct contact with an outside edge of the charge transfer junction, said junction termination layer extending outwards from the outside edge of the charge transfer junction, said junction termination layer also being doped with a doping material of a second doping type in sufficient concentration to provide a charge depletion region adjacent the outside edge of the charge transfer junction when the charge transfer junction is reverse biased.

While the above technique may be applied to any semiconductor device, it may be especially well suited to any of the Group III-IV nitrides (e.g., GaN) or SiC. It may also be applied to materials such as SiGe.

DETAILED DESCRIPTION OF AN ILLUSTRATED EMBODIMENT

Figure 1:
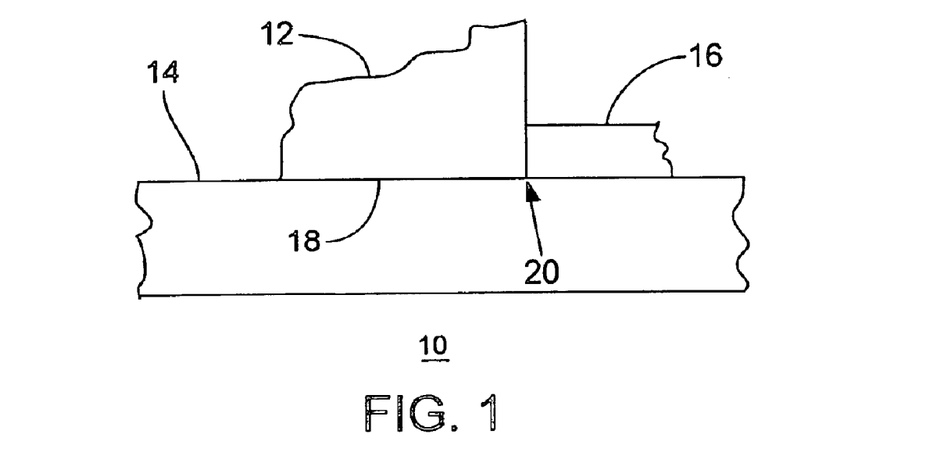
FIG. 1 is a cut-away view of a current transfer junction of a SiC diode using a junction termination extension under an illustrated embodiment of the invention.

FIG. 1 depicts a junction portion of a semiconductor device (e.g., a silicon-carbide (SiC) diode) 10 under an illustrated embodiment of the invention. As shown, an electrode 12 forms a charge transfer junction 18 where it contacts a drift region 14 of a first doping type. A junction termination extension (JTE) 16 of a constant thickness and of a second doping type is shown disposed directly against the drift region 14 and against an outside edge of the charge transfer junction 18. When the charge transfer junction 18 is reversed biased, the junction termination extension 16 provides a charge depletion region adjacent the edge 20 that functions to reduce a voltage gradient proximate a sharp outside corner of the outside edge 20.

As used herein, an electrode means either the anode or a cathode of the semiconductor device. In addition, the term electrode means a current carrying structure formed of metal or of a semiconductor formed by standard fabrication techniques (e.g., epitaxial growth, ion-implantation, material deposition, etc.).

It should also be noted that the term "outside edge" refers to the edge itself and not to the surfaces that define the edge. As such, a JTE disposed directly against one of the surfaces that define the outside edge at the point where the edge is defined is also disposed directly against the outside edge.

Turning first to design considerations, an explanation will first be offered of the processes involved in designing a SiC Schottky diode with the novel JTE. Following a description of the design considerations, a number of examples will be provided of Schottky and P-i-N SiC diodes that incorporate the novel JTE.

The first step in designing a Schottky diode is to design the parallel-plane portion of the diode. The planar diode is created by having a one-dimensional structure with the anode and cathode at either end. The breakdown of a diode occurs due to one of two mechanisms. The first mechanism is reach-through of a lightly doped epitaxial layer, and the second is avalanche breakdown at the pn junction. For a lightly doped epitaxial layer, the charge in the epi drift region may not be enough to avoid reach-through. The entire drift layer is depleted in such devices and electric field builds up in the drift region until the critical electric field is reached at the reverse-biased junction.

Reach-through determines the maximum sustainable voltage across a drift region with a specific width and doping. The design of the planar diode provides two important parameters for designing the Schottky diode, namely drift region doping and thickness. The necessary drift region parameters ($W_D$ and $N_D$) may be estimated to minimize the on-state resistance of the device while meeting the breakdown voltage requirement. This methodology generates the drift region parameters ($W_D$ and $N_D$) for an ideal parallel-plane junction as listed in Table I.

The next step in designing the Schottky diode is to determine the breakdown characteristics of the device with a finite anode. A finite anode introduces high electric field at the edges. The depletion region formed by the metal/semiconductor junction extends beyond the edges of the anode. For a planar diode, this depletion region is swept towards the cathode as a plane, and an evenly distributed electric field is induced across the length of the diode.

A diode with an anode of finite length changes this characteristic. The depletion region extends laterally from the periphery of the anode. This mechanism causes the depletion region to bend around the edge regions and corners of the anode. The curvature of the space-charge region causes an increase in the electric field density. As the depletion region expands further at higher reverse bias voltage across the device, carrier generation occurs in the semiconductor regions with high electric field. This type of breakdown, known as avalanche breakdown, occurs at voltages much lower than what the ideal parallel-plane device can handle.

Figure 3A:
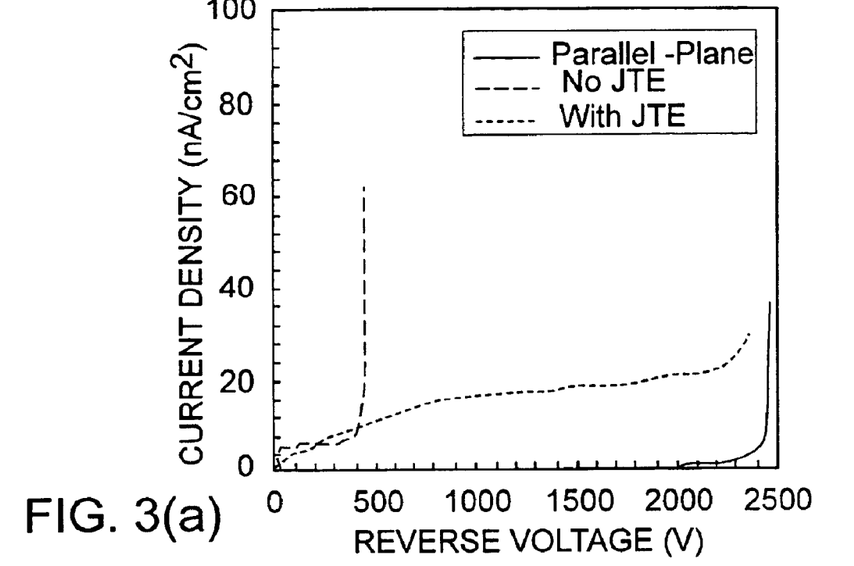
FIGS. 3a–b depict the breakdown performance of the terminated SiC Schottky of FIG. 2, an unterminated SiC Schottky diode, an ideal SiC junction and the impact generation rate at the breakdown of the unterminated diode.

FIG. 3(a) shows simulated results comparing an ideal, parallel plane diode with comparable diodes, both with and without a junction termination extension. The simulated results show that the breakdown voltage of the practical diode without a junction termination extension is only a fraction of the parallel-plane diode. The practical diode with a junction termination extension is much better.

Figure 3B:
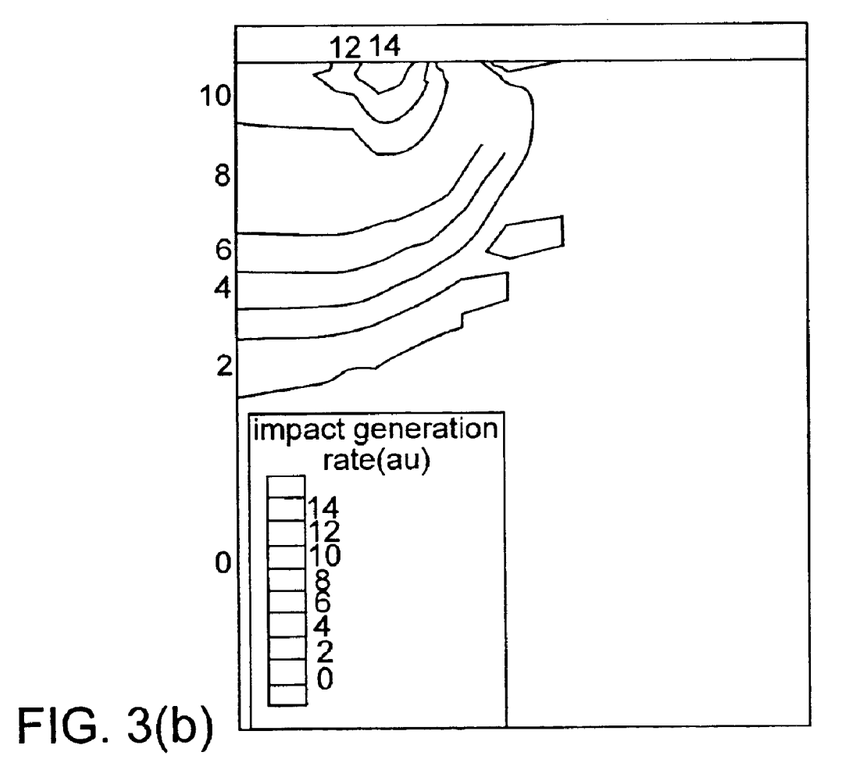

FIG. 3(b) illustrates the two-dimensional distribution of the impact ionization rate within the device at breakdown. This phenomenon leads to premature device breakdown, and makes it necessary to properly terminate the edges of the diode to increase its breakdown voltage.

Figure 2:
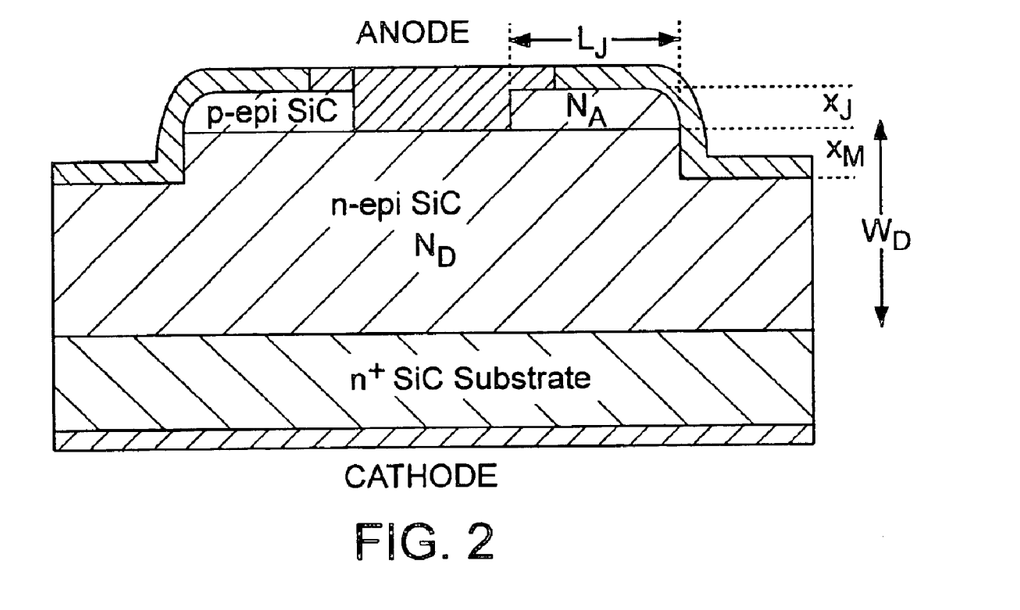
FIG. 2 depicts a Schottky diode using the junction termination extension of FIG. 1.

The Junction Termination Extension (JTE) is used to reduce the electric field at the edges of the Schottky device as shown in FIG. 2. The JTE has four main parameters that can be altered to affect the breakdown characteristics of the device. These parameters are: JTE doping ($N_A$), JTE length ($L_j$), JTE depth ($X_j$), and mesa depth ($X_m$), as indicated in FIG. 2. The fabrication of the JTE has been briefly described earlier. The JTE increases the breakdown voltage of the diode by reducing the electric field density within the semiconductor near the edges of the device. The p-type SiC of the JTE counteracts the bending of the depletion region around the edges of the anode. This effect spreads out the electric field at the corners and edges of the depletion region.

A detailed two dimensional (2-D) simulation study was conducted to determine the influence of JTE parameters on device breakdown performance and to identify hi the optimum set of parameters for near-ideal breakdown performance. Catastrophic failure at the device periphery is a commonly reported failure condition of many (e.g., SiC) diodes under static and dynamic electrical and thermal stresses. In order to suppress this, the region of maximum electric field may be re-located into the bulk of the device near the main junction instead of the device periphery. An optimum doping range may be identified to ensure breakdown of the main diode and not the JTE region. It is expected that for very low doping in the JTE region, the JTE depletes rapidly and breakdown occurs at the edge of the main junction.

Figure 4A:
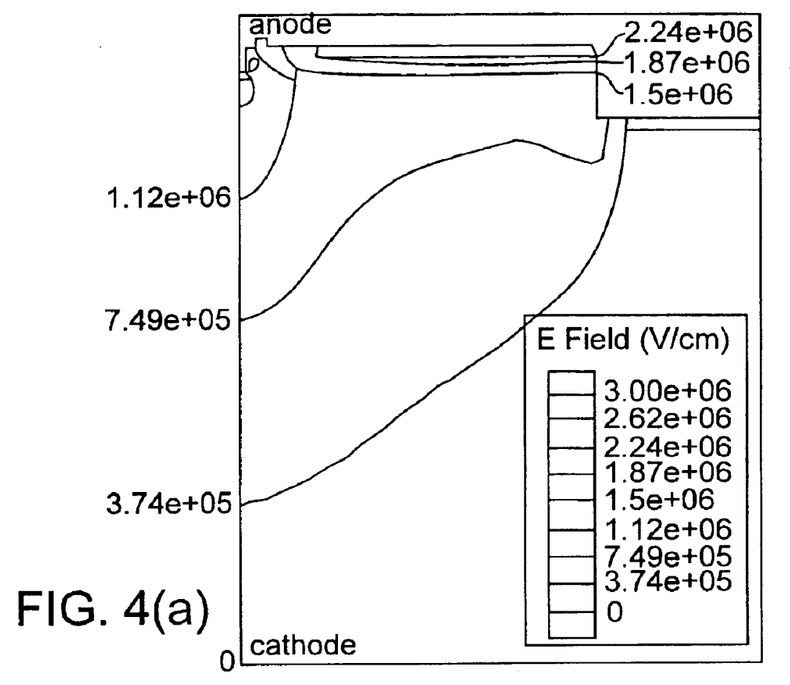
FIGS. 4a–b depict electric field parameters affecting breakdown performance of the terminated diode of FIG. 2.
Figure 4B:
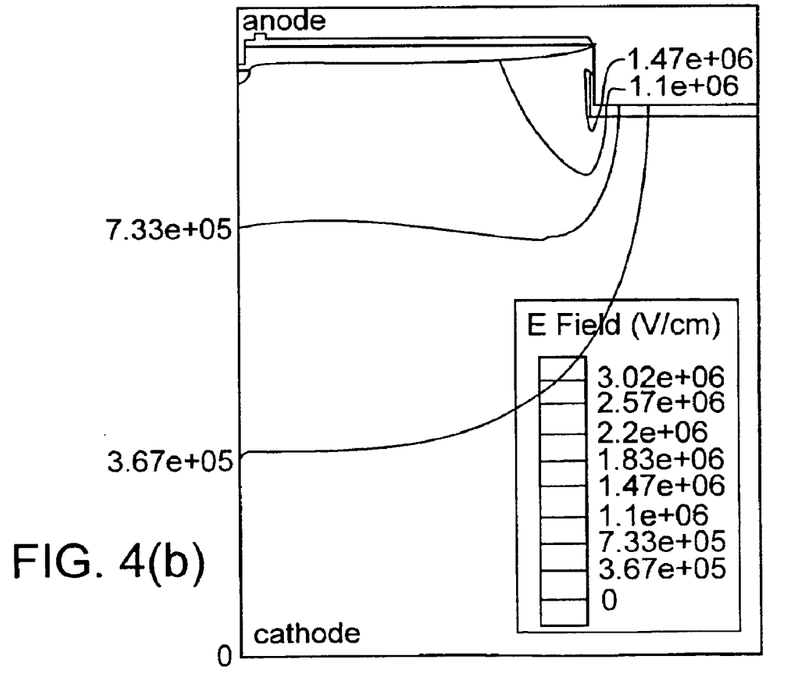

As the JTE doping is increased, the electric field is distributed more evenly across the device. At higher JTE dopings, the electric field at the device periphery approaches the case of a P-i-N diode and the breakdown voltage is expected to fall off. This has been confirmed experimentally in the case of Si diodes. The simulated breakdown location of the diode for JTE doping ($N_D$) of $1\times10^{16}$ cm$^{-3}$ and $1\times10^{17}$ cm$^{-3}$ is indicated in FIG. 4, justifying the expected trend. The optimum JTE doping was found to lie between these extreme limits.

Figure 5A:
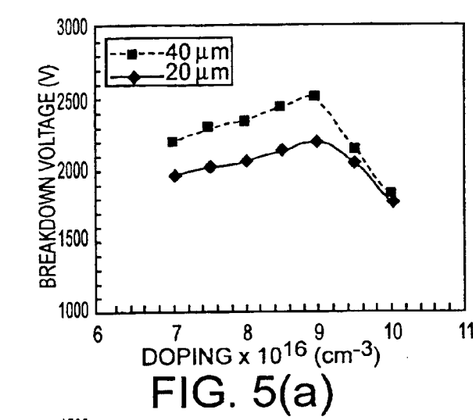
FIGS. 5a–b depicts breakdown versus doping data of the diode of FIG. 2.
Figure 5B:
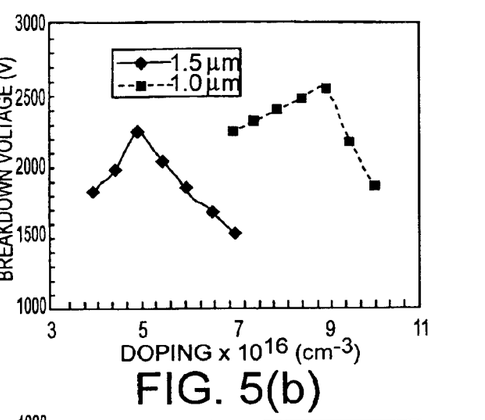
Figure 6A:
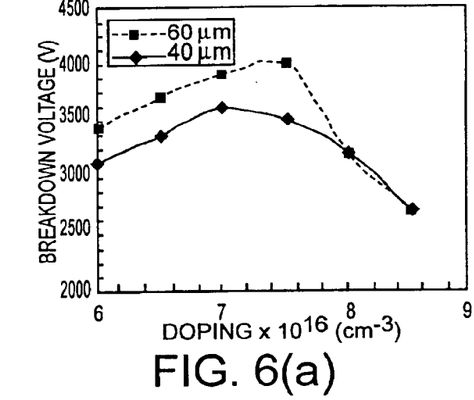
FIGS. 6a–b depicts breakdown versus doping data of the diode of FIG. 2.
Figure 6B:
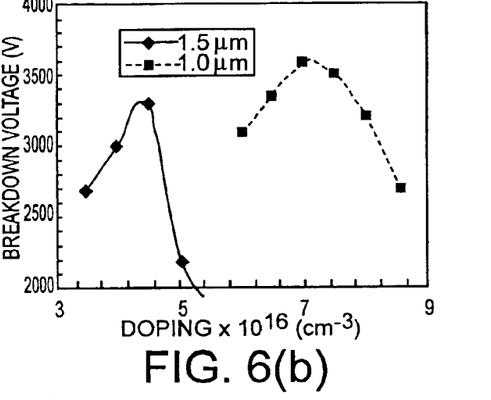
Figure 7A:
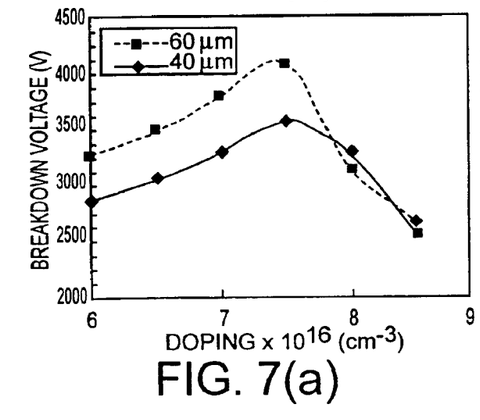
FIGS. 7a–b depicts breakdown versus doping data of the diode of FIG. 2.
Figure 7B:
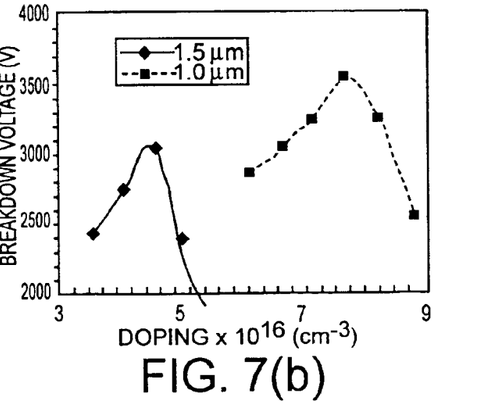

The sensitivity of breakdown voltage of the three diodes to JTE doping, length, and depth is shown in FIGS. 5, 6 and 7. FIG. 5 shows the dependence of breakdown voltage of a 2 kV Schottky diode ($N_D=2\times10^{15}$ cm$^{-3}$, $W_D=20\,\mu$m) on (a) JTE doping/length for $X_j=1.5$ $\mu$m, $X_M=5$ $\mu$m, (b) JTE doping/thickness for $L_j=20\,\mu$m, $x_M=5$ $\mu$m. FIG. 6 shows the dependence of breakdown voltage of a 4 kV Schottky diode ($N_D=8\times10^{14}$ cm$^{-3}$, $W_D=40\,\mu$m) on (a) JTE doping/length for $X_j=1.0$ $\mu$m, $X_M=5$ $\mu$m, (b) JTE doping/thickness for $L_j=40$ $\mu$m, $X_M=5$ $\mu$m. FIG. 7 shows the dependence of breakdown voltage of a 4 kV Schottky diode ($N_D=1\times10^{15}$ cm$^{-3}$, $W_D=50$ $\mu$m) on (a) JTE doping/length for $X_j=1.0$ $\mu$m, $X_M=5$ $\mu$m, (b) JTE doping/thickness for $L_j=40$ $\mu$m, $X_M=5$ $\mu$m.

For a given choice of JTE length and depth, and mesa depth, the breakdown voltage has a maximum value for a certain JTE doping, as explained above. Making the JTE layer thicker increases the charge in the terminating layer. This pushes the highest breakdown voltage to lower values of JTE doping. It was observed that the breakdown voltage is very sensitive to JTE doping for thicker layers. Thinner layers (about 1 μm) are more tolerant to variations in JTE doping. Additionally, the thinner layers shift the breakdown voltage to higher doping levels, which is advantageous from the viewpoint of fabrication. This trend was observed at all device ratings, except that peak performance occurs at lower doping levels at higher breakdown voltage. Optimum process parameters are chosen to cover this parameter variation. When the device breakdown occurs at the periphery of the terminating layer, the performance is very sensitive to parameter variations, such as mesa depth, slope, and the characteristics of the passivation layer. However, if the design parameters are such that the breakdown occurs at the main junction, the performance was found to be virtually insensitive to variations in the parameters at the periphery. This strongly suggests that the JTE parameters should be chosen so as to force breakdown to occur at the main junction. This will result in slightly inferior performance than the best possible design. However, accounting for the uncertainty in breakdown parameters used for analysis and the possibility of dielectric breakdown and arcing, the pessimistic design is quite justified.

It is noted here that the metal forming the Schottky contact at the main junction also overlaps a portion of the JTE layer. The presence of a P-i-N diode in parallel with the Schottky diode leads to convergence problems during simulations. In order to circumvent this, the metal was replaced with a very thin layer of p+ SiC. The presence of a junction at the main diode and the terminating layer aids the convergence process without altering the simulation accuracy. As shown in FIG. 3(a), the simulated breakdown voltage of the device with optimum termination is better than 85% of the ideal value. An approximation of the optimum JTE parameters for a particular set of Schottky diodes is provided in Table I.

TABLE I

| | | | |
|---|---|---|---|
| Drift Region Width ($W_D$) | 20 μm | 40 μm | 50 μm |
| Drift Region Doping ($N_D$) | $2 \times 10^{15}$ cm$^{-3}$ | $8 \times 10^{14}$ cm$^{-3}$ | $1 \times 10^{15}$ cm$^{-3}$ |
| Ideal Breakdown (V) | 2.5 kV | 5 kV | 5 kV |
| Terminated Breakdown (V) | 2.35 kV | 3.9 kV | 3.8 kV |
| JTE Doping ($N_A$) | $8 \times 10^{16}$ cm$^{-3}$ | $7 \times 10^{16}$ cm$^{-3}$ | $7 \times 10^{16}$ cm$^{-3}$ |
| JTE Length ($L_j$) | 30 μm | 60 μm | 60 μm |
| JTE Depth ($X_j$) | 1 μm | 1 μm | 1 μm |
| Mesa Depth ($X_M$) | 3 μm | 3 μm | 3 μm |
| Passivation | Oxide | Oxide | Oxide |

Figure 8A:
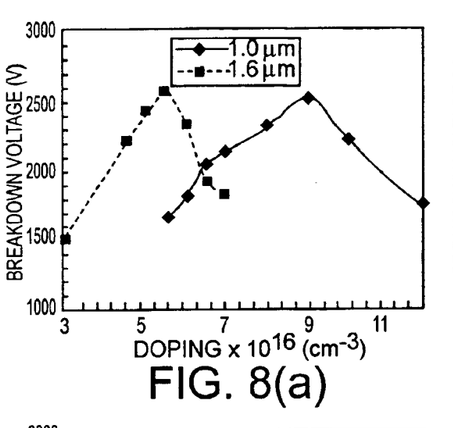
FIGS. 8a–b depicts breakdown versus voltage data of the diode of FIG. 2.
Figure 8B:
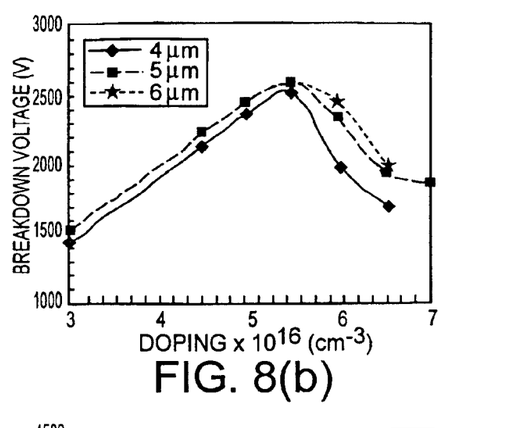
Figure 9A:
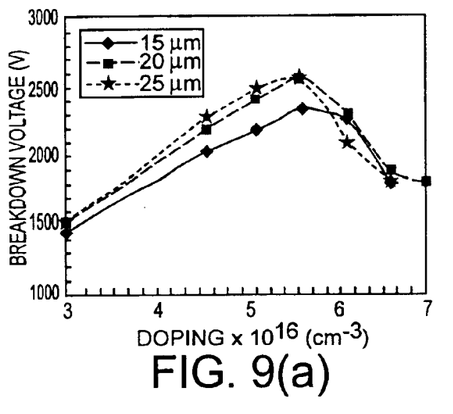
FIGS. 9a–b depicts breakdown versus voltage data of the diode of FIG. 2.
Figure 9B:
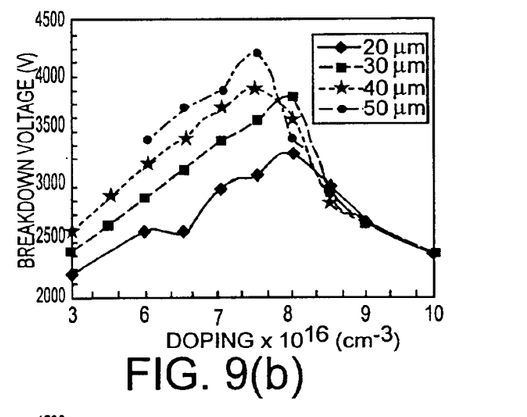
Figure 10A:
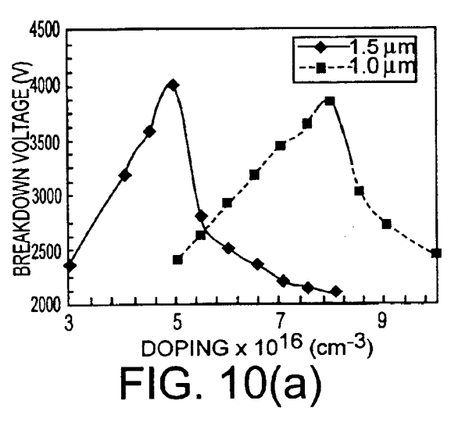
FIGS. 10a–b depicts breakdown versus voltage data of the diode of FIG. 2.
Figure 10B:
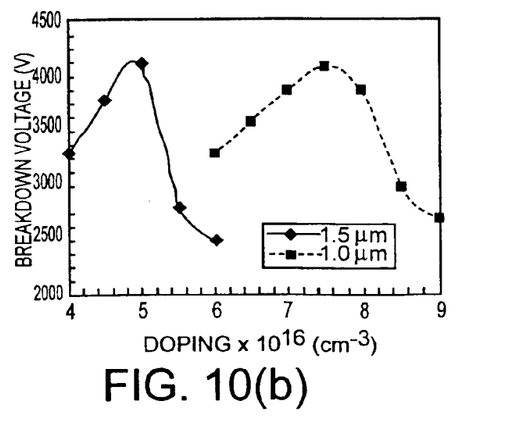

Unterminated P-i-N diodes have a performance similar to that of Schottky diodes. The structure shown in FIG. 11 was simulated to obtain the best edge termination design for this type of P-i-N diode. It was found that the observations made in case of Schottky diodes are also valid for P-i-N diodes. Representative plots of the dependence of breakdown performance on device doping and dimensions are plotted in FIGS. 8, 9 and 10. FIG. 8 shows the dependence of breakdown voltage of a 2 kV P-i-N diode ($N_D$=2×10$^{15}$ cm$^{-3}$, $W_D$=20 μm) on (a) JTE doping/length for $L_j$=1.5 μm, $X_M$=5 μm and (b) mesa thickness for $L_j$=20 μm, $X_j$=1.6 μm. FIG. 9 shows the dependence of breakdown voltage of (a) a 2 kV P-i-N diode ($N_D$=2×10$^{15}$ cm$^{-3}$, $W_D$=20 μm) and (b) a 4 kV P-i-N diode ($N_D$=8×10$^{14}$ cm$^{-3}$, $W_D$=40 μm) on JTE doping/length for $X_j$=1.0 μm, $X_M$=5 μm. FIG. 10 shows the dependence of breakdown voltage of (a) a 4 kV P-i-N diode ($N_D$=8×10$^{14}$ cm$^{-3}$, $W_D$=40 μm) and (b) a 4 kV P-i-N diode ($N_D$=1×10$^{15}$ cm$^{-3}$, $W_D$=50 μm) on JTE doping/length for $L_j$=40 μm, $X_M$=5 μm.

In particular, FIG. 8 plots the dependence of the breakdown voltage of the 2 kV diode on JTE thickness and mesa depth. Clearly, the mesa depth has a stronger influence on performance at higher doping levels, because breakdown is occurring at the periphery. The breakdown performance of 2 kV diodes saturates around 30 μm (FIG. 9a), while that of the 4 kV diodes saturates around 60 μm (FIG. 9b). Finally, it has been found that the breakdown performance in more tolerant to parameter variation with thinner JTE layers. The consistency between the performance of P-i-N and Schottky diodes indicates that identical processes are governing the breakdown performance of both devices. It is noted that the performance of unterminated devices is dissimilar. An approximation of the optimum performance parameters of P-i-N diodes is provided in Table II.

TABLE II

| | | | |
|---|---|---|---|
| Drift Region Width ($W_D$) | 20 μm | 40 μm | 50 μm |
| Drift Region Doping ($N_D$) | $2 \times 10^{15}$ cm$^{-3}$ | $8 \times 10^{14}$ cm$^{-3}$ | $1 \times 10^{15}$ cm$^{-3}$ |
| Ideal Breakdown (V) | 2.5 kv | 5 kV | 5 kV |
| Terminated Breakdown (V) | 2.3 kV | 3.9 kV | 4.2 kV |
| JTE Doping ($N_A$) | $8 \times 10^{16}$ cm$^{-3}$ | $7 \times 10^{16}$ cm$^{-3}$ | $7 \times 10^{16}$ cm$^{-3}$ |
| JTE Length ($L_j$) | 30 μm | 60 μm | 60 μm |
| JTE Depth ($X_j$) | 1 μm | 1 μm | 1 μm |
| Mesa Depth ($X_M$) | 3 μm | 3 μm | 3 μm |
| Passivation | Oxide | Oxide | Oxide |

In summary, optimized edge termination designs have been identified for 4H—SiC Schottky and P-i-N diodes for rated breakdown voltages of 2 kV and 4 kV. Limited by process variations, the designs are expected to provide better than 80% of the ideal parallel-plane breakdown of the diodes.

Figure 11:
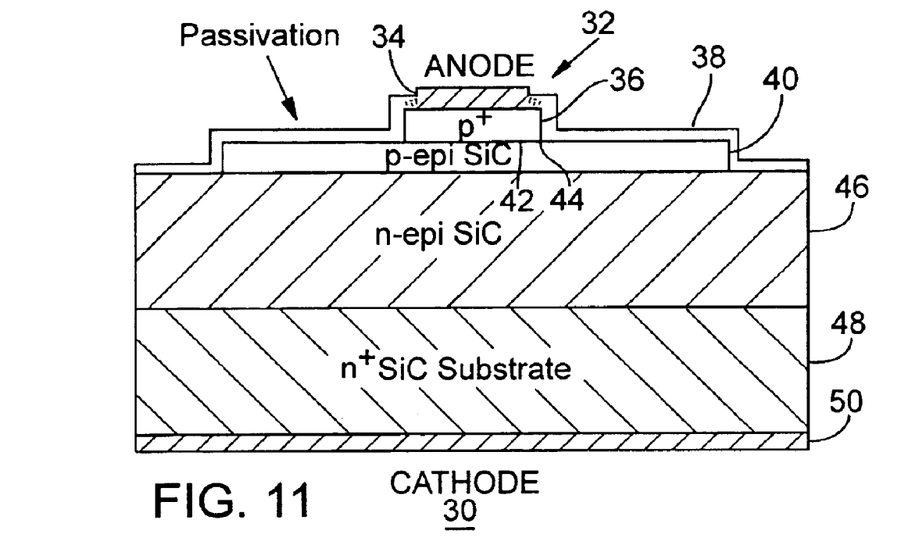
FIG. 11 is a modified example of a P-i-N diode using the junction termination extension of FIG. 1.

FIG. 11 provides an example of the general concepts of FIG. 1. FIG. 11 depicts a SiC P-i-N diode 30. In FIG. 11, the JTE 40 of the diode 30 is provided as a continuous layer of a constant thickness interposed between the anode 32 and drift region 46. As shown, the JTE 40 is disposed directly onto the drift region 46. The JTE 40 is also in direct contact with the outside edge 44 and extends outwards from the edge 44 of the anode 32.

The anode 32 may include a metallic layer 34 forming an ohmic contact with a heavily doped p+ region 36 (e.g., doped to a level of 10$^{18}$ cm$^{-3}$). The JTE layer 40 may be of a less heavily doped p-type material (e.g., doped to a level of 10$^{17}$ cm$^{-3}$). The heavier doping of the p+ region 36 causes the primary current transfer junction 42 of the diode 30 to exist at the interface between the p+ region 36 and p-type material 40.

The use of the JTE 40 functions to reduce a voltage gradient around a relatively sharp outside edge 44 of the current transfer junction 42 when the diode 30 is reverse biased. By reducing the voltage gradient around the outside edge 44, the diode 30 has a superior breakdown voltage because the highest electric field experienced by the diode 30 is now limited to a central portion of the current transfer junction 42 instead of around the device periphery 44.

Under application of a reverse voltage to the diode 30, a depletion region supporting the voltage develops within the n-epi, drift region 46. The p+ region 36 is heavily doped and prevents expansion of a depletion region into the p+ region 36. Thus, the entire voltage appears at the periphery 44 of the p+ region 36. However, the JTE region 40 is doped lower than the p+ region, but higher than the n-epi, drift region 46. Hence, the depletion layer ($W_{p-epi}$) expands into the JTE region 40 as governed by the following equation.

$$W_T = \sqrt{\frac{2\varepsilon V_R}{q}\left(\frac{1}{N_{n-epi}} + \frac{1}{N_{p-epi}}\right)} = W_{n-epi} + W_{p-epi}, \text{ and}$$

$$W_{n-epi}N_{n-epi} = W_{p-epi}N_{p-epi}.$$

The appearance of a depletion region in the JTE region 40 causes a lateral potential drop extending outwards from the edge 44 of the charge transfer region 42 towards the outside edge of the JTE region 40. Consequently, the voltage at the periphery of the JTE region 40 is much lower than within the central region.

Figure 12A:
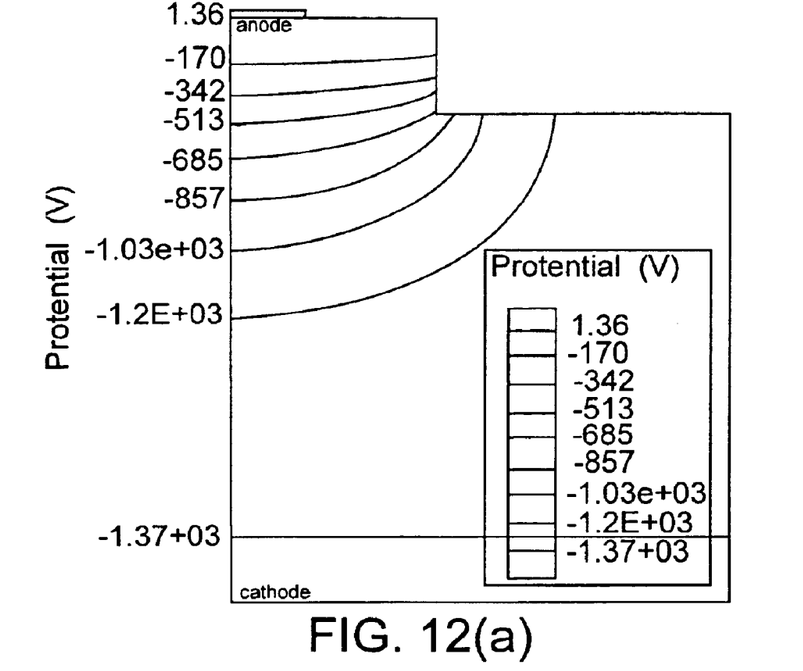
FIGS. 12a–b depicts a potential distribution and electric field contours at breakdown of the diode of FIG. 11.
Figure 12B:
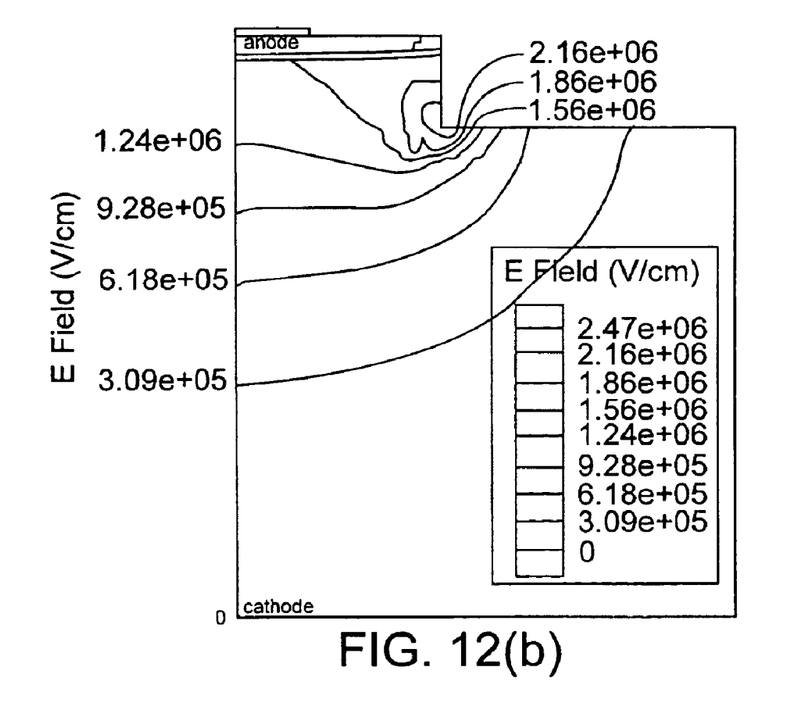

The potential distribution (i.e., the gradient) and electric field at breakdown of the diode 30 are shown in FIGS. 12a and 12b, respectively. The information of FIGS. 12a–b clearly shows the ability of the JTE 40 to force the maximum electric field to the central portion of the current transfer junction 42.

Figure 13:
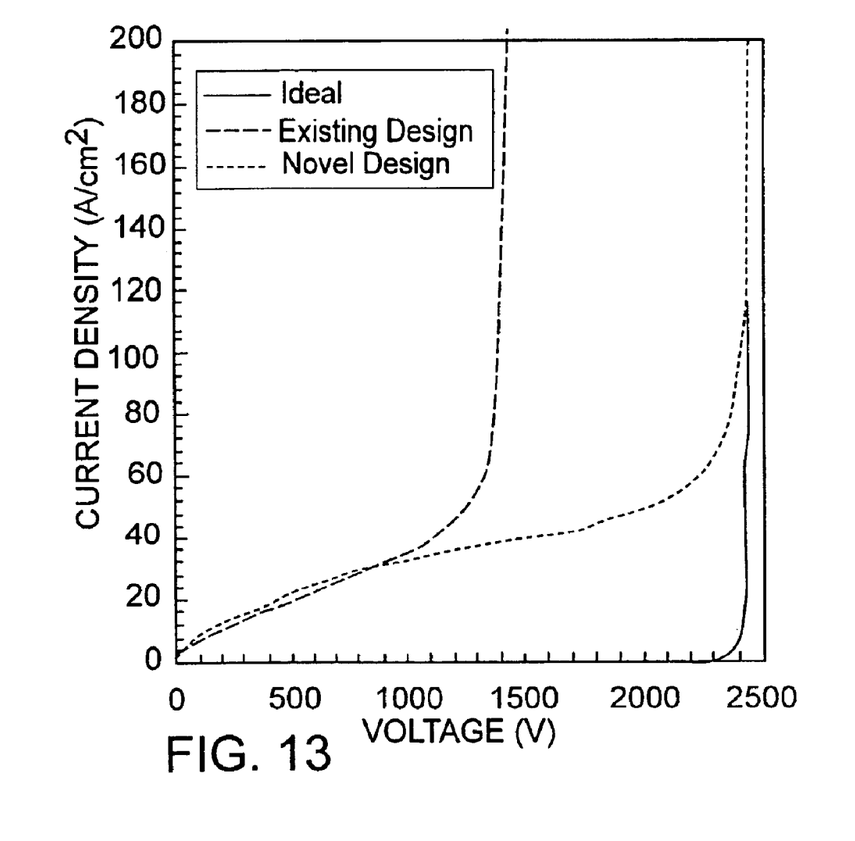
FIG. 13 depicts a reverse bias current density of the diode of FIG. 11.

FIG. 13 depicts comparative data regarding the diode 30. The solid tracing labeled "Ideal" depicts a current density of what would be recognized by those of skill in the art as an ideal diode. The tracing labeled "Existing Design" shows a current density of a similar diode without the JTE 40 of FIG. 11. The tracing labeled "Novel Design" shows the current density of the diode of FIG. 11.

The diode 30 of FIG. 11 may be fabricated by first growing an n-type epitaxial drift layer 46 on a heavily doped n-type SiC substrate 48. Successive layers including a moderately doped layer 40 (~$10^{17}$ cm$^{-3}$) and a heavily doped layer 36 (~$10^{18}$ cm$^{-3}$) of p-type SiC, each about 1 μm thick, are grown on the n-epi layer 46. The p+ layer 36 is etched back in selected areas until the p-epi layer 40 is exposed around the periphery of the current transfer junction 42. The area covered by the p+ layer 36 defines the area of the current transfer junction 42. The surrounding p-epi region 40 serves as the junction termination extension. A passivation layer 38 is grown on the wafer to minimize surface effects. For electrical compatibility, it is preferable that the dielectric constant of the passivation layer be close to that of SiC. At the periphery of the JTE region 40, the p-epi layer 40 is etched back to expose the n-epi layer 46. This provides isolation between adjacent diodes on the same wafer.

In general, the selective removal of SiC layers may take place by dry or wet etching. Thus, a very clean interface is obtained. Either dry etching techniques, like reactive ion etching (RIE) or variants (e.g., ICP, wet etching techniques, etc.) may be used to define the anode. Wet etching may involve local oxidation of the SiC (LOCOS) surface, and subsequent removal of the oxide layer. The "bird's beak" formed during the LOCOS process may be used to favorably slope the sidewalls of the device. Alternatively, electrochemical etching could be used to realize this structure, especially since the etching is sensitive to doping type and doping density. The doping and extent of the p-epi layer 40 constituting the edge termination is chosen so as to obtain the desired breakdown performance. Since the depletion region does not reach the semiconductor surface, the leakage current due to surface effects is suppressed.

Figure 14:
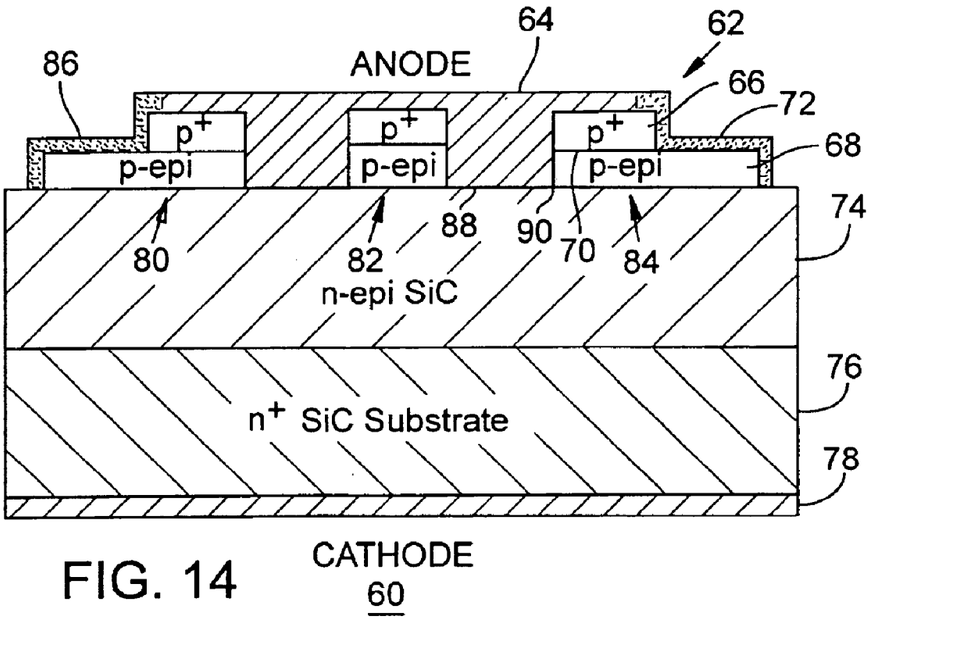
FIG. 14 depicts the junction termination extension of FIG. 1 under an alternate embodiment.

FIG. 14 depicts a merged PiN-Schottky (MPS) diode 60 with a reduced forward voltage drop over that of the diode 30 of FIG. 11. In general, silicon-carbide pn junction diodes suffer from high forward voltage drop due to the wide band gap of the material. In contrast, the forward voltage drop of Schottky diodes is dependent only on the work function difference between the semiconductor and the metal contact. With a suitable contact metal, the voltage drop of SiC Schottky diodes can be made comparable to Si diodes. However, the reverse characteristics of Schottky diodes are strongly dependent on the applied reverse voltage. The reverse leakage current is much higher than that of pn diodes. For practical applications of SiC Schottky rectifiers, it is essential to limit the reverse current at the maximum reverse voltage to acceptable values. In this approach, the metal-semiconductor interface of the Schottky diodes is screened from high fields during reverse biasing. This is realized by forming a geometrical structure of p-type anode regions 80, 82, 84 located at the surface of the drift region below the Schottky metal. Current flow in forward bias takes place through the Schottky areas.

Figure 15:
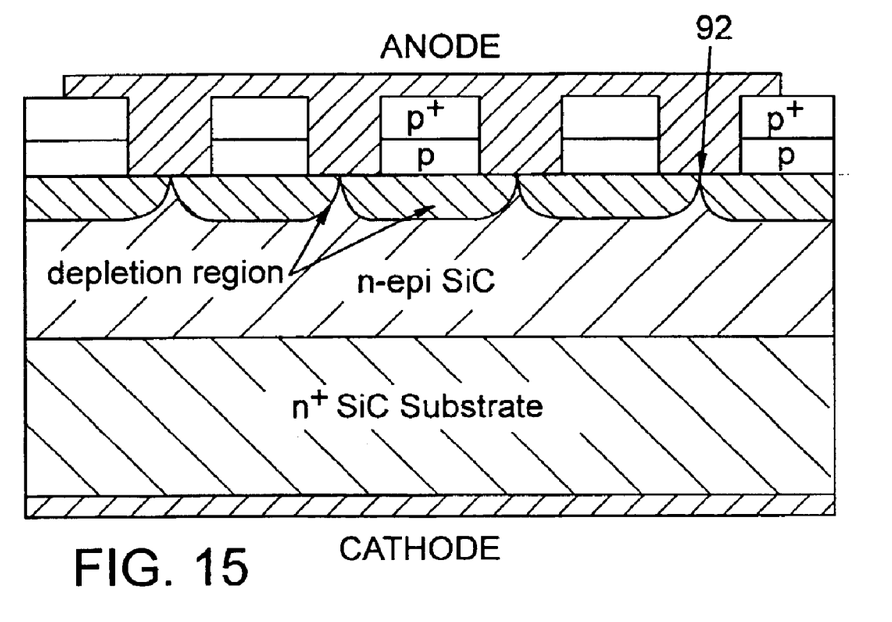
FIG. 15 depicts a charge depletion diagram of the diode of FIG. 14.

Under reverse bias, the depletion region of the pn junction expands away from the junction laterally as well as vertically. The leakage current flows through the Schottky contact as well as the PiN contact. At higher voltage levels, the depletion regions from the pn junction of either side of the Schottky contact merge as shown in reference area 92 of FIG. 15. When this happens, the depletion region from the PiN diode draws all the reverse current, thus shielding the Schottky diode. Consequently, the reverse leakage current of the overall device is limited to a value close to the pn junction leakage current of the diode 30 of FIG. 11.

In order to enhance the ability of the diode 60 to resist reverse voltages, a junction termination extension region may be used in conjunction with the p-type anode regions 80, 84 along the periphery of the diode 60. The anode regions 80, 84 may include a p+ anode 66 and a JTE layer 68. As above, the JTE layer 68 has a relatively constant thickness and is in direct contact with the drift region 74. The JTE layer 68 is also in direct contact with what would otherwise be a charge transfer region 70 and extends past an outside edge 72 of the charge transfer region 70.

Further, the JTE layer 68 assumes the same relationship with respect to the Schottky junction 88. More specifically, the JTE 68 is in direct contact with an outside edge 90 of the Schottky current transfer junction 88 and it extends past the outside edge of the Schottky current transfer junction. The net effect is that the JTE layer 68 reduces the voltage gradients at the edges 72, 90 of both the PiN and Schottky junctions 70, 88.

The diode 60 of FIG. 14 may be fabricated by first growing an n-type epitaxial drift layer 74 on a heavily doped n-type SiC substrate 76. Successive layers including a medium doped layer 68 (~$10^{17}$ cm$^{-3}$) and a heavily doped layer 66 (~$10^8$ cm$^{-3}$) of p-type SiC, each on the order of 1 μ thick, are grown on the n-epi layer 74. The p+ layer 68 is etched back in a cross-hatch pattern and around a periphery until the p-epi layer 68 is exposed. The cross-hatch pattern of the p-epi layer 68 is further etched until the n-epi drift layer 74 is exposed. The discrete regions of p-epi layers 66, 68 together constitute the PiN diode, and the regions with n-epi layer 74 in direct contact with the anode metal layer 64 constitute the Schottky diode. A blanket of metal connects the PiN diode (regions with p+ layer) in parallel with the Schottky diode. The surrounding p-epi region 68 serves as the junction termination extension. A passivation layer 86 is grown on the p-epi layer 68 to minimize surface effects. For electrical compatibility, it is preferable that the dielectric constant of the passivation layer be close to that of SiC. At the periphery of the JTE region 68, the p-epi layer 68 is etched back to expose the n-epi layer 74. This provides isolation between adjacent diodes on the same wafer.

In general, the selective removal of SiC layers may take place by dry or wet etching. Thus, a very clean interface is obtained. Either dry etching techniques, like reactive ion etching (RIE) or variants (e.g., ICP, wet etching techniques, etc.) may be used to define the anode. Wet etching may involve local oxidation of the SiC (LOCOS) surface, and subsequent removal of the oxide layer. The "bird's beak" formed during the LOCOS process may be used to favorably slope the sidewalls of the device. Alternatively, electrochemical etching could be used to realize this structure, especially since the etching is stopped at the pn junction. The doping and extent of the p-epi layer 40 constituting the edge termination is chosen so as to obtain the desired breakdown performance. Since the depletion region does not reach the semiconductor surface, the leakage current due to surface effects is suppressed.

Figure 16:
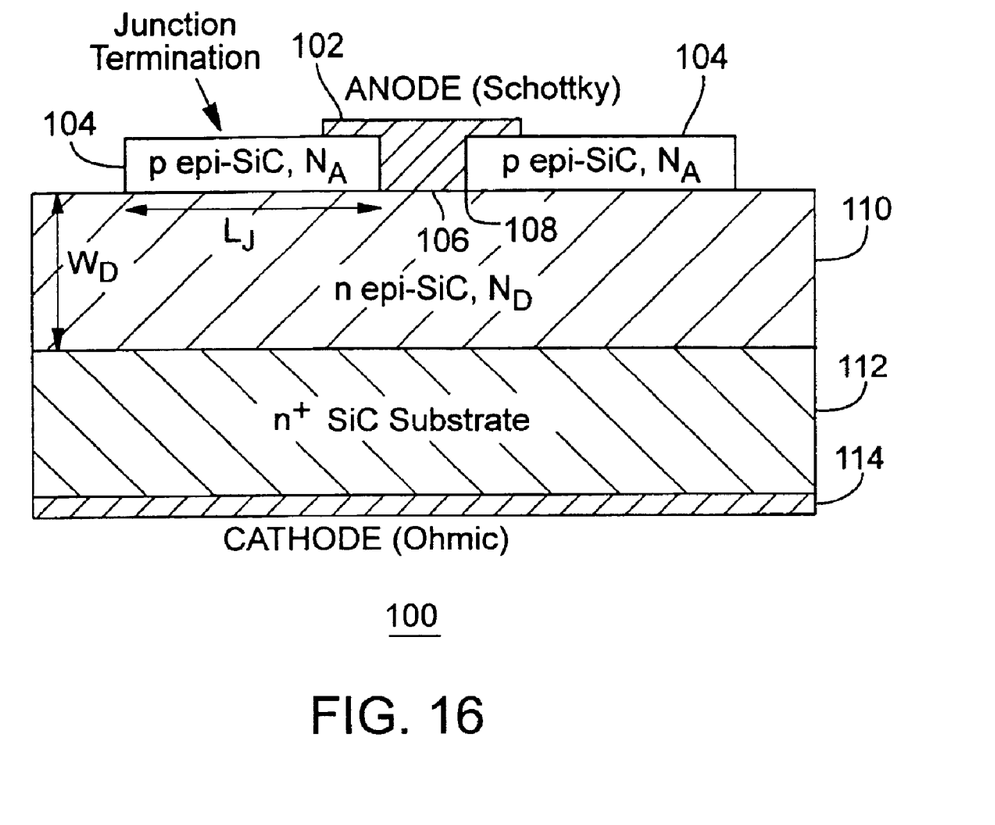
FIG. 16 depicts a Schottky diode using the junction termination extension of FIG. 1.

FIG. 16 depicts the use of an JTE 104 in the context of a Schottky diode 100. As with the previous examples, the JTE 104 is placed directly against an outside edge 108 of the current transfer junction 106 of the Schottky interface. The use of the JTE 104 functions to spread the electric field of the outside edge 108 over the length $L_J$, instead of simply shaping the field at the edge 108. The doping of the JTE layer 104 is carefully chosen so that the depletion expands in the JTE layer 104, just as it expands in the n-epi layer 110, albeit to a much lower extent.

The Schottky diode 100 may be created by processes similar to those discussed above. Initially an n-type epitaxial drift layer 110 is grown on a heavily doped n-type SiC substrate 112. A moderately doped ($\sim 10^{17}$ cm$^{-3}$) p-type layer 104 of up to 1 μm thick is grown on the n-epi layer 110. The active area is defined by selective wet oxidation of the wafer surface. The exposed SiC is converted to $SiO_2$ and can be removed by means of etching. Thus, a very clean interface is obtained. Either dry etching techniques, like reactive ion etching (RIE) or variants (e.g., ICP, wet etching techniques, etc.) may be used to define the anode. Alternatively, electrochemical etching could be used to realize this structure, especially since the etching is stopped at the pn junction. The doping and extent of the p-epi layer 104 constituting the edge termination is chosen so as to obtain the desired breakdown performance. Since the depletion region does not reach the semiconductor surface, the leakage current due to surface effects is suppressed. A p-region isolation is required between devices on the same wafer.

The JTE 104 of the diode 100 is different than the guard rings of the prior art because the prior art guard rings only shape the electric field at the device edge. On the other hand, the JTEs described above serves not only to spread the field at the edge of the current transfer junction, but also to extend the breakdown voltage to values close to the ideal parallel plane breakdown voltage.

Figure 17A:
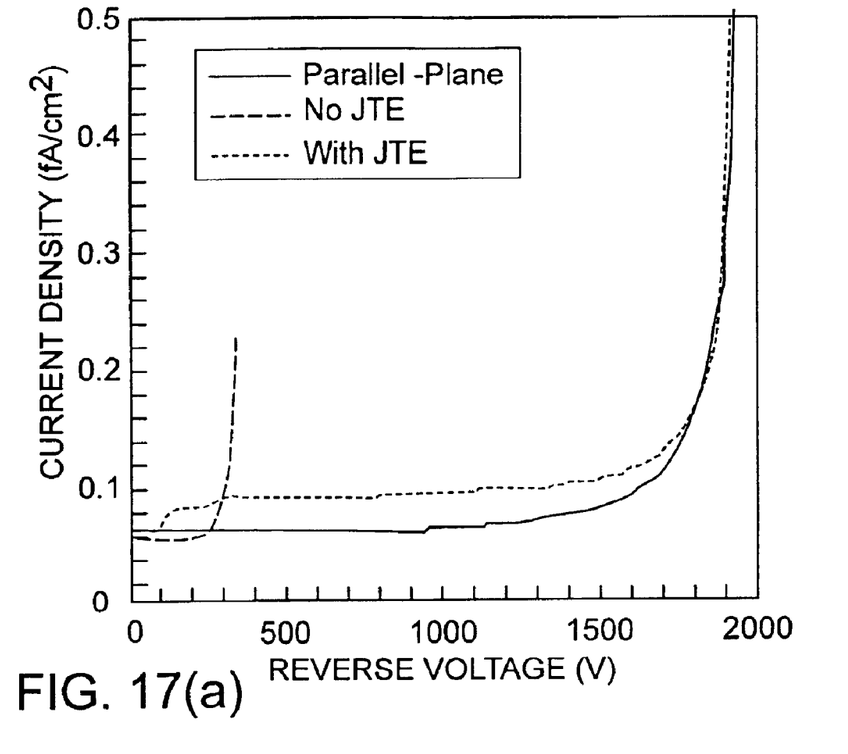
FIGS. 17a–b depicts a reverse bias current density distribution and potential distribution of the diode of FIG. 16.
Figure 17B:
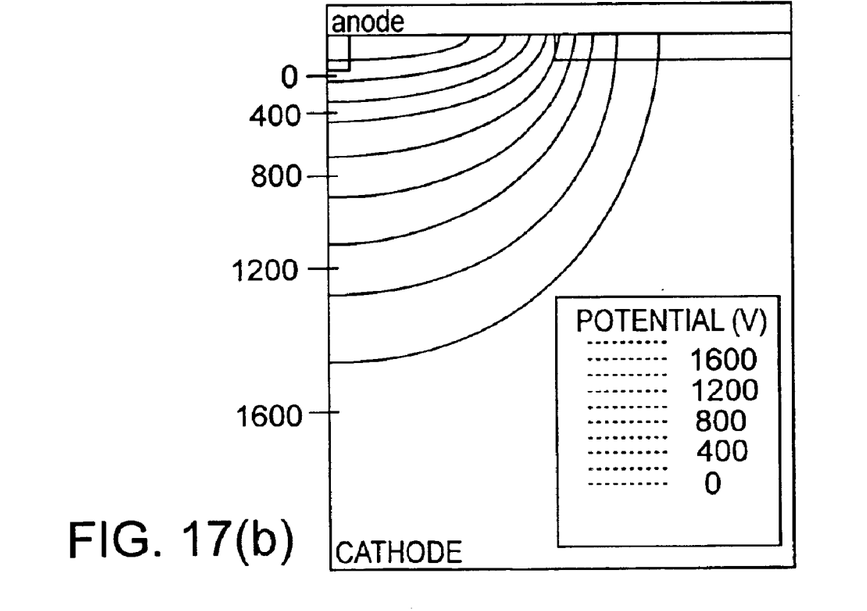

FIG. 17a depicts a current density of an ideal diode, the diode 100 and a diode similar to diode 100, but without the JTE 104. As may be noted from FIG. 17a, the diode 100 substantially matches ideal diode performance at reverse voltages above 1500 volts. FIG. 17b shows a voltage distribution that may be experienced within the diode 100 at breakdown.

In general, all edge termination techniques are directed to spreading out the electric field at the edge of the power semiconductor device. Techniques such as implantation with high energy argon, boron or vanadium can enhance the breakdown voltage close to its ideal limit, but the associated leakage current is too high to be acceptable. The use of guard rings is efficient only if the desired breakdown voltage is relatively low (<600 volts). Heavily doped guard rings are not suitable for high voltage edge termination.

The surface use of junction termination extension is sometimes used in high voltage silicon devices. However, the use of implantation to achieve surface junction termination extensions damages the SiC surface, and is hence undesireable. The methods described above, describes a method of defining a junction termination extension around a diode that provides minimal leakage current and no surface damage.

A comparison may be made between the area consumed by a diode using prior art edge termination techniques (e.g., amorphization, mesa formation, ion implantation, etc.) and the technique described above. The area consumed by the devices described herein 10, 30, 60, 100 is normalized against the area required by prior art techniques. The normalized area may be expressed as $$\text{Normalized Die Area} = \frac{\text{Area with Novel Technique}}{\text{Prior Art Area}}$$

A 500 V, 1 A, P-i-N diode designed as described herein requires 88% of the prior art diode area. The improvement is more noticeable at higher voltage ratings. It is projected that the 2 kV, 1 A diode will require only 50% of the prior art diode area.

A 500 V, 1 A, Schottky diode designed as described herein requires 90% of the prior art diode area. It is projected that the 2 kV, 1 A Schottky diode will require 80% of the prior art diode area.

A specific embodiment of a method and apparatus for constructing composite images according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of improving breakdown voltage of a semiconductor device which includes a Schottky charge transfer junction, such method comprising the steps of:

coupling a metal electrode of the semiconductor device to a drift layer of the semiconductor device through a Schottky charge transfer junction, said drift layer being of a first doping type, at least a portion of said metal electrode in direct contact with said drift layer to form the Schottky charge transfer junction; and providing a junction termination layer of a relatively constant thickness in direct contact with the drift layer of the semiconductor device and laterally adjacent the metal electrode along an outside edge of the charge transfer junction;

said junction termination layer extending outwards from the Schottky charge transfer junction, said junction termination layer having a controlled length and being doped with a doping material of a second doping type in sufficient concentration to provide a charge depletion region laterally adjacent the outside edge of the Schottky charge transfer junction when the Schottky charge transfer junction is reverse biased.

2. The method of improving the breakdown voltage as in claim 1 further comprising doping the junction termination layer with a doping material of the second type to a concentration of on the order of $10^{17}$ cm$^{-3}$.

3. The method of improving the breakdown voltage as in claim 1 further comprising passivating an external surface of the junction termination layer.

4. The method of improving the breakdown voltage as in claim 1 further comprising defining the current transfer junction as a merged PiN-Schottky charge transfer junction wherein a PiN charge transfer junction is formed adjoining the Schottky charge transfer junction by forming an epitaxial layer atop a portion of the drift layer and doping the epitaxial layer with a doping material of the second doping type.

5. The method of improving the breakdown voltage as in claim 4 further comprising disposing a plurality of PiN charge transfer junctions around a periphery of the semiconductor device.

6. The method of improving the breakdown voltage as in claim 5 wherein the step of disposing a plurality of PiN charge transfer junctions around a periphery of the semiconductor device further comprises extending the junction termination layer underneath each of the plurality of PiN charge transfer junctions.

7. The method of improving the breakdown voltage as in claim 4, in which the drift layer and the epitaxial layer are formed of the same semiconductor material of opposite doping types.

8. The method of improving the breakdown voltage as in claim 4 in which the epitaxial layer atop a portion of the drift layer includes at least two epitaxial layers doped with a doping material of the second doping type in different doping concentrations.

9. A method of improving the breakdown voltage as in claim 1 further comprising a mesa region defined by a recess formed outside the junction termination layer and extending a predetermined depth into said drift layer.

10. A method of improving the breakdown voltage as in claim 9 further comprising disposing a layer of passivation material of a predetermined thickness on top of exposed surfaces of the junction termination layer and the drift layer in said recess.

11. The method of improving the breakdown voltage as in claim 1 further comprising doping the junction termination layer with a doping material of the second type to a concentration greater than a doping concentration of the drift layer.

12. The method of improving the breakdown voltage as in claim 1, in which the drift layer is formed of silicon carbide.

13. The method of improving the breakdown voltage as in claim 1, in which the junction termination layer is formed of silicon carbide.

14. The method of improving the breakdown voltage as in claim 1, in which the drift layer is formed of silicon carbide and the junction termination layer is formed of epitaxial silicon carbide.

15. The method of improving the breakdown voltage as in claim 1, in which the drift layer and the junction termination layer are formed of the same semiconductor material of opposite doping types.

16. The method of improving the breakdown voltage as in claim 1 in which providing the junction termination layer comprises forming an epitaxial layer atop a portion of the drift layer and doping the epitaxial layer with a doping material of the second doping type.

17. The method of improving the breakdown voltage as in claim 16 in which the junction termination layer is formed by a single epitaxial layer.

18. The method of improving the breakdown voltage as in claim 1 in which the drift layer is of n-type doping and the junction termination layer is of p-type doping.

19. The method of improving breakdown voltage of a semiconductor device as in claim 1 in which the junction termination is formed by a first epitaxial layer of a length $L_j$ and a second epitaxial layer atop the first epitaxial layer, the second epitaxial layer having a length less than length $L_j$ and having a doping of the same dopant type as the first epitaxial layer in a concentration greater than the concentration in the first epitaxial layer.

20. A method of improving breakdown voltage of a semiconductor device which includes a Schottky charge transfer junction, such method comprising:

coupling a metal electrode of the semiconductor device to a drift layer of the semiconductor device through a Schottky charge transfer junction, said drift layer being of a first doping type in a doping concentration $N_D$, at least a portion of said metal electrode in direct contact with said drift layer to form the Schottky charge transfer junction; and providing a junction termination layer of a relatively constant thickness $X_j$ in direct contact with the drift layer of the semiconductor device and laterally adjacent the metal electrode along an outside edge of the charge transfer junction;

said junction termination layer extending outwards from the Schottky charge transfer junction, said junction termination layer being doped with a doping material of a second doping type in sufficient concentration $N_A$ to provide a charge depletion region laterally adjacent the outside edge of the Schottky charge transfer junction when the Schottky charge transfer junction is reverse biased; and controlling one or more of a thickness $W_D$ of the drift layer and a length $L_j$ of the junction termination layer to distribute charge beneath the junction termination layer.

21. A method of improving breakdown voltage of a semiconductor device according to claim 20 including forming the semiconductor device in a mesa in which a peripheral portion of the drift layer is recessed relative to an interface between the junction termination layer and the drift layer by a depth $X_m$ controlled to force breakdown to occur at the Schottky charge transfer junction.

22. A method of improving breakdown voltage of a semiconductor device according to claim 21 including forming a passivation layer over the exposed surfaces of the junction termination layer and drift layer.

23. The method of improving breakdown voltage of a semiconductor device as in claim 19 in which the junction termination is formed by a first epitaxial layer of a length $L_j$ and a second epitaxial layer atop the first epitaxial layer, the second epitaxial layer having a length less than length $L_j$ and having a doping of the same dopant type as the first epitaxial layer in a concentration greater than the concentration in the first epitaxial layer.

24. A method of improving breakdown voltage of a semiconductor device which includes a Schottky charge transfer junction, such method comprising:

coupling a metal electrode of the semiconductor device to a drift layer of the semiconductor device through a Schottky charge transfer junction, said drift layer being of a first doping type in a doping concentration $N_D$, at least a portion of said metal electrode in direct contact with said drift layer to form the Schottky charge transfer junction; and providing a junction termination layer of a relatively constant thickness $X_j$ in direct contact with the drift layer of the semiconductor device and laterally adjacent the metal electrode along an outside edge of the charge transfer junction;

said junction termination layer extending outwards from the Schottky charge transfer junction, said junction termination layer being doped with a doping material of a second doping type in sufficient concentration $N_A$ to provide a charge depletion region laterally adjacent the outside edge of the Schottky charge transfer junction when the Schottky charge transfer junction is reverse biased; and forming the semiconductor device in a mesa in which a peripheral portion of the drift layer is recessed relative to an interface between the junction termination layer and the drift layer by a depth $X_m$ controlled to force breakdown to occur at the Schottky charge transfer junction.

25. The method of improving breakdown voltage of a semiconductor device as in claim 24 in which the junction termination is formed by a first epitaxial layer of a length $L_j$ and a second epitaxial layer atop the first epitaxial layer, the second epitaxial layer having a length less than length $L_j$ and having a doping of the same dopant type as the first epitaxial layer in a concentration greater than the concentration in the first epitaxial layer.

* * * * *